United States Patent [19]

Kawamoto

[11] 3,855,605

[45] Dec. 17, 1974

[54] CARRIER INJECTED AVALANCHE DEVICE

[75] Inventor: Hirohisa Kawamoto, Hightstown, N.J.

[73] Assignee: RCA Corporation, New York, N.Y.

[22] Filed: July 27, 1973

[21] Appl. No.: 383,081

Related U.S. Application Data

[63] Continuation of Ser. No. 263,991, June 19, 1972, abandoned.

[52] U.S. Cl. ........................ 357/13, 357/57, 357/58

[51] Int. Cl. .......................... H01l 1/00, H01l 13/00

[58] Field of Search .................. 317/235 AD, 235 T

[56] References Cited

UNITED STATES PATENTS

| | | | |
|---|---|---|---|
| 3,192,400 | 6/1965 | Statz et al. | 307/88.5 |
| 3,469,117 | 9/1969 | Mizushima et al. | 307/302 |
| 3,544,855 | 12/1970 | Nannichi | 317/234 |
| 3,761,783 | 9/1973 | Kroger et al. | 317/234 R |

*Primary Examiner*—Rudolph V. Rolinec
*Assistant Examiner*—Joseph E. Clawson, Jr.
*Attorney, Agent, or Firm*—Joseph D. Lazar; Edward J. Norton

[57] ABSTRACT

The use of externally injected carriers for biasing a diode into an avalanche mode of operation is disclosed.

4 Claims, 4 Drawing Figures

PATENTED DEC 17 1974 3,855,605

CARRIER INJECTED AVALANCHE DEVICE

This is a continuation, of application Ser. No. 263,991, filed June 19, 1972, now abandoned.

DESCRIPTION OF THE PRIOR ART

Avalanche diodes have been described in the prior art as generators of microwave signals. The prior art avalanche diodes are typically triggered into operation by a reverse bias signal having a magnitude exceeding a predetermined threshold level. The avalanche diodes generate a current pulse in response to the applied reverse bias signal. A description of avalanche diodes operating in the high efficiency mode has been published in RCA Review, Sept. 1969, Volume 30, No. 3 in an article entitled "A Theory for the High-Efficiency Mode of Oscillation in Avalanche Diodes" by A. S. Clorfeine et al. Prior art avalanche diode circuits are not capable of generating a relatively large amplitude current pulse in response to a relatively low voltage input pulse.

SUMMARY OF THE INVENTION

A two terminal avalanche diode having at least first, second and third crystalline semiconductor layers is disclosed. The first and third layers of a highly doped semiconductor material form junctions with the second layer of a lightly doped semiconductor material. The type of doping in the second layer is the same as that of the third layer but different from that of the first layer. A reverse bias signal having a magnitude less than a predetermined threshold level is applied across the diode terminals. By injecting external carriers into the second semiconductor layer, a carrier injected avalanche device is provided which generates a relatively large amplitude output current pulse in response to the injected carriers,

DESCRIPTION OF THE PREFERRED EMBODIMENT

Figure 1:
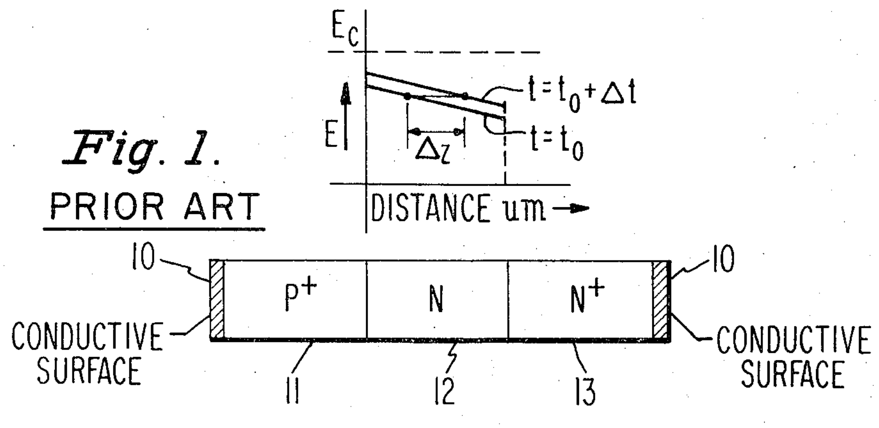
Fig. 1. PRIOR ART
FIG. 1 is illustrative of the construction details of a typical avalanche diode.

Referring to FIG. 1, there is shown the construction details of a typical avalanche diode. Such a diode is known in the prior art. The diode comprises a first highly doped crystalline semiconductor layer 11, a second lightly doped crystalline semiconductor layer 12, and a third highly doped crystalline semiconductor layer 13. The doping density determines the conductivity of the semiconductor layers 11, 12 and 13. Thus, the first and third semiconductor layers 11 and 13 are highly conductive and the conductivity of the second semiconductor layer 12 is low. The type of doping in the second and third layers 12 and 13 is the same but different from the type of doping in the first layer 11. The details of construction and boundary conditions for operation has been discussed in the RCA Review, Sept. 1969, Volume 30, No. 3 in an article entitled "A Theory for the High-Efficiency Mode of Oscillation in Avalanche Diodes." An abrupt junction $p^+$-$n$-$n^+$ silicon diode is used as one example of an avalanche diode.

FIG. 1 is also illustrative of the electric field, E, present in the $n$-region when the diode is influenced by an external current density, J. At a time, $t=t_o$, the electric field, E, is assumed to have "punched through" the $n$-$n^+$ boundary. However, the magnitude of the electric field, at time $t=t_o$, is not large enough to produce significant ionization. There is negligible conduction current in the absence of such ionization and the displacement current is equal to the external current density, J. The electric field at a point within the $n$-region of the diode increases with the passage of time and the slope of the electric field within the $n$-region is given by Poisson's equation $$\Delta E/\Delta Z = qn_d/\epsilon \tag{1}$$

where $\Delta E$ is the changing electric field, $q = 1.6 \times 10^{-19}$ coulomb, $\epsilon$ is the dielectric constant, $n_d$ is the ionized doping density, and $\Delta Z$ is an incremental width in the $n$-region.

Additional carriers are generated in the n-region of the diode through impact ionization. The rate of carrier generation is $$dc/dt = \alpha(E) \cdot V_s \cdot c \tag{2}$$

where $\alpha(E)$ is the impact ionization coefficient, $V_s$ is the saturation velocity of the carriers and $c$ is the free carrier density. The magnitude of the ionization coefficient $\alpha(E)$ is rapidly increased when the magnitude of the electric field, E, in the $n$-region exceeds a critical threshold magnitude, $E_c$. Under these conditions the increased number of carriers exceed the ionized doping density $n_d$. Impact ionization generates both holes and electrons. The holes and electrons migrate in opposite directions in the $n$-region creating an electron rich region and a hole rich region. The result is a drastic reduction in the magnitude of the electric field in the middle of the $n$-region.

When the magnitude of the electric field becomes relatively small, the velocity of the electrons and holes is substantially reduced, leading to the formation of a dense trapped plasma. The requirements for forming the dense plasma and the changing electric field levels allow for the operation of an avalanche diode in the anomalous mode. The diode transmits high frequency energy when coupled to a critically designed microwave circuit and a reverse bias signal creating an electric field exceeding ac critical threshold magnitude $E_c$ is coupled across the diode electrodes 10.

Figure 2:
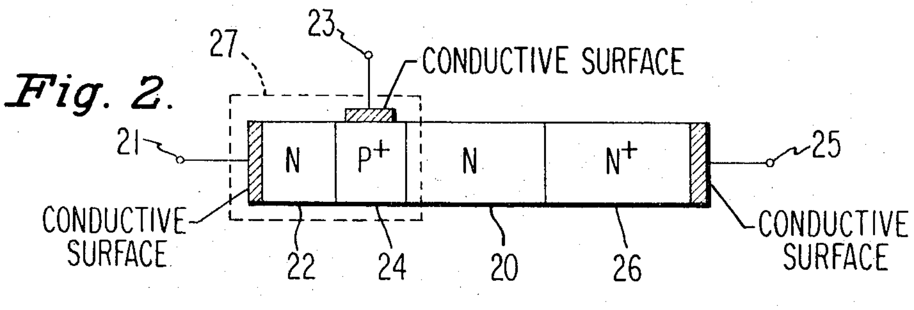
FIG. 2 is illustrative of the construction details of a carrier injected avalanche device according to one embodiment of the present invention.

In a carrier injected avalanche device according to the present invention, the rate of carrier generation is increased by injecting carriers into the n-region from an external source instead of increasing the ionization coefficient $\alpha(E)$. Referring to FIG. 2, there is shown the construction details of a carrier injected avalanche device illustrating the concept of external carrier injection into the $n$-region 20 of a typical avalanche diode. It is desired to establish the electron rich region necessary for the precipitous collapse of the electric field across the $n$-region 20 and the generation of a large current pulse. However, it is not desirable to create such an event by the use of a large external signal, the magnitude of which establishes an electric field exceeding a critical threshold value, $E_c$. According to the present invention, the magnitude of a reverse bias signal is determined to establish an electric field within the $n$-region 20 equal to but not exceeding the critical magnitude of electric field, $E_c$, previously described as necessary in prior art avalanche diode operation. The injection of external carriers into the n-region 20 of a critically reverse biased avalanche diode structure is employed to trigger the extensive impact ionization which leads to the necessary trapped plasma previously discussed, and the resulting collapse of the electric fields within the $n$-region 20. The excess of carriers and collapsing electric field generates a relatively large amplitude current pulse useful in numerous electronic circuits. Since the process of establishing the trapped plasma and collapsing the electric field occurs over a relatively short time interval, the device is suitable for GHz rate pulse generation and amplification.

The device of the present invention has three input terminals. A first input terminal 21 is coupled to a conductive surface on a second $n$-region 22 added to the basic avalanche diode structure. A second input terminal 23 is coupled to a conductive surface of the relatively thin width $p^+$ region 24 of the basic avalanche diode structure. A third input terminal 25 is coupled to a conductive surface of the $n^+$ 26 region of the basic avalanche diode structure. Under operating conditions, the second input terminal 23 receives a relatively low magnitude forward bias signal relative to the potential at the first input terminal 21, and the third input terminal 25 receives a relatively large magnitude reverse bias signal relative to the potential at the first terminal 21. The magnitude of the applied reverse bias signal between terminals 21, 25 is substantially equal to the breakdown voltage of the avalanche diode but does not establish an electric field in the $n$-region having a magnitude exceeding the critical value $E_c$. The magnitude of the applied forward bias signal causes the $n$-$p^+$ structure 27 to inject electrons into the $n$-region of the basic avalanche diode structure triggering the desired current pulse output signal.

The new carrier injected avalanche device is unlike a typical three terminal transistor. The magnitude of the electric field in the $n$-region of a typical transistor does not usually equal or exceed the magnitude of the critical electric field of a typical avalanche diode. The typical transistor is not reverse biased to the point of forming an internal plasma region and a precipitous collapse of an internal electric field which in turn produces a relatively large output current pulse. Unlike transistors, the carrier injected avalanche device requires a punch through structure to confine the electron-hole plasma within the $n$-region.

Figure 3:
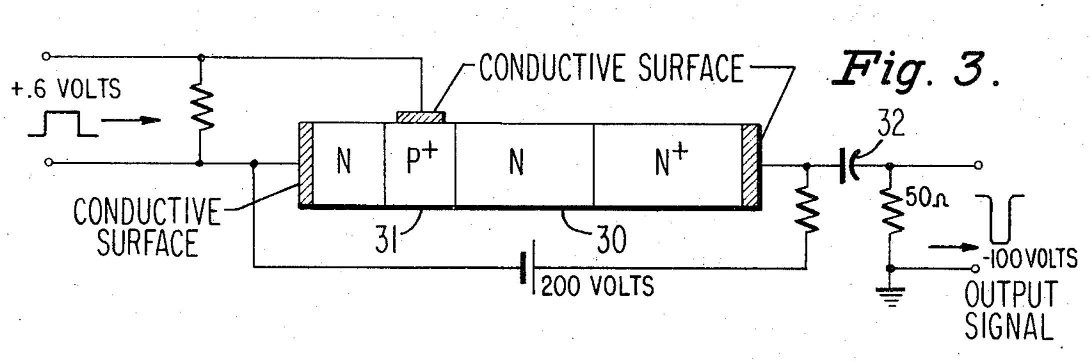
FIG. 3 is a schematic of a voltage pulse amplifier using a carrier injected avalanche device.

Referring to FIG. 3, there is shown a voltage pulse amplifier using the carrier injected avalanche device illustrated in FIG. 2. A 0.6 volt input pulse with a 5 nanosecond pulse width is applied across the first and second terminals corresponding to terminals 21, 23 of FIG. 2 of the carrier injected avalanche device. The 0.6 volt input pulse is a forward bias signal which causes the $n$-$p^+$ structure to inject electrons into the $n$-region 30 of the basic avalanche diode structure. A 200 volt reverse bias signal is coupled between the first and the third terminals of the carrier injected avalanche device corresponding to terminals 21, 25 of FIG. 2. The breakdown voltage characteristic of the diode, for example, may be substantially 200 volts. The reverse bias signal alone is not sufficient to cause the device of FIG. 3 to be triggered into operation. The combination of carrier injection and reverse bias signal stimulates the carrier injected avalanche device into operation. A 100 volt, 5 nanosecond wide output pulse is produced across the terminals of the 50 ohm resistor. The width of the $n$-region 30 of the carrier injected avalanche device used in one application of the circuit of FIG. 3 was $20\mu m$. The width of the $p^+$ region 31 of the carrier injected avalanche device was $2\mu m$. The doping density of the $n$-region 30 was $6 \times 10^{14}/cm^3$. A 100 pf. blocking capacitor 32 prevents the coupling of the D.C. bias signal to the output circuit.

Figure 4:
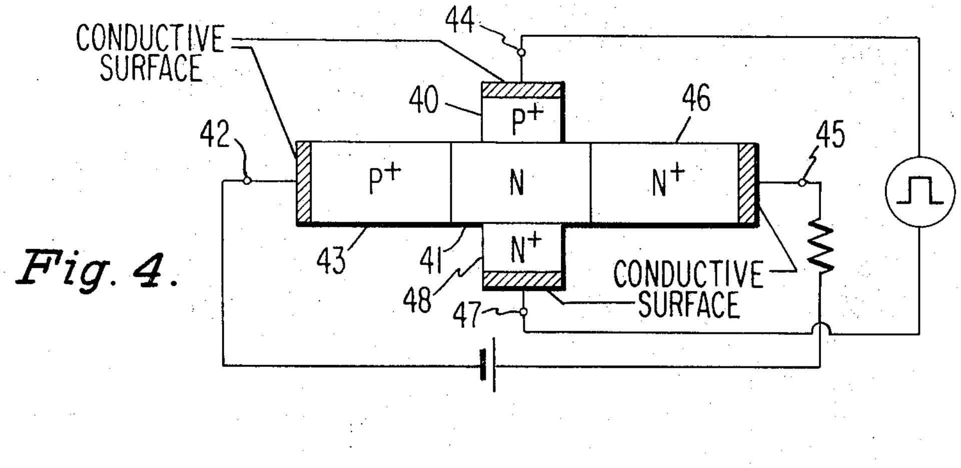
FIG. 4 is illustrative of the construction details for an alternative method for injecting carriers into the n-region of the basic avalanche diode structure.

Referring to FIG. 4, there is shown an alternative technique for injecting carriers into the $n$-region of the basic avalanche diode structure. A second $p^+$ region 40 and a second $n^+$ region 48 are added to the $n$-region 41 of the basic avalanche diode structure for the purpose of hole injection. A first input terminal 42 is coupled to a conductive surface on the $p^+$ region 43 of the basic avalanche diode structure. A second input terminal 44 is coupled to a conductive surface on the second added $p^+$ region 40. A third input terminal 45 is coupled to a conductive surface on the $n^+$ region 46 of the basic avalanche diode structure. A fourth input terminal 47 is coupled to a conductive surface on the second added $n^+$ region 48. A reverse bias signal is applied between the first input terminal 42 and the third input terminal 45 as was the case in FIG. 3. The magnitude of the reverse bias signal can be substantially equal to the breakdown voltage of the carrier injected avalanche device. A forward bias signal is coupled between the fourth input terminal 47 and the second input terminal 44, the region 40 being forward biased relative to the region 48. The magnitude of the forward bias signal is sufficient to cause hole injection into the $n$-region 41 of the basic avalanche diode structure. The output can be taken at terminal 45.

Several examples of possible carrier injection from an external source into a basic avalanche diode structure have been illustrated. Various other embodiments and modifications thereof will be apparent to those skilled in the art, and will fall within the scope of invention as defined in the following claims. As an example, a $p^+$-$n$-$n^+$ silicon structure has been used as an illustration of a carrier injected avalanche device but a $n^+$-$p$-$p^+$ germanium structure would be suitable as an alternative device with appropriate changes in bias polarities where necessary.

What is claimed is:

1. In combination, an avalanche diode having at least first, second and third crystalline semiconductor layers, said first and third layers being relatively highly doped semiconductor material and forming junctions with said second layer, said second layer being relatively lightly doped semiconductor material having a type of doping the same as said third layer but different from said first layer, said diode caused to operate in response to an electric field exceeding a critical magnitude within said second layer and having a magnitude greater than zero at said junction between said second and third layers, means for applying a reverse bias signal across said first and third layers, said bias signal having a magnitude exceeding punch-through voltage, said bias signal establishing an electric field having a magnitude within said second layer substantially equal to but not exceeding the said critical magnitude of electric field necessary for said diode operation, said electric field having a magnitude greater than zero at said junction between said second and third semiconductor layers and, means for injecting carriers into said second semiconductor layer for increasing said electric field magnitude to exceed said critical magnitude for causing said diode operation.

2. In the combination of claim 1, said carrier injecting means including a fourth crystalline semiconductor layer forming a junction with said first semiconductor layer.

3. In the combination of claim 1, said carrier injecting means including a fourth and fifth crystalline semiconductor layers forming a junction with said second semiconductor layer.

4. A voltage pulse amplifier comprising a carrier injected avalanche device having at least first, second, third, and fourth crystalline semiconductor layers, said first and third layers being relatively lightly doped semiconductor material, said second and fourth layers being relatively highly doped semiconductor material and forming junctions with said third layer, said first layer forming a junction with said second layer, said device caused to operate in response to an electric field exceeding a critical magnitude within said second layer and having a magnitude greater than zero at said junction between said second and third layers, means for applying a reverse bias signal across said first and fourth semiconductor layers, said bias signal having a magnitude exceeding punch-through voltage, said bias signal establishing an electric field having a magnitude within said second layer substantially equal to but not exceeding said critical magnitude of electric field necessary for said device operation, said electric field having a magnitude greater than zero at said junction between said second and third semiconductor layers, and means for applying a forward bias signal across said first and second semiconductor layers, whereby carriers are injected into said third semiconductor layer and said device is triggered into generating a large amplitude current pulse relative to said forward bias signal.

* * * * *